US009644963B2

(12) United States Patent
Lee et al.

(10) Patent No.: US 9,644,963 B2
(45) Date of Patent: May 9, 2017

(54) APPARATUS AND METHODS FOR PLL-BASED GYROSCOPE GAIN CONTROL, QUADRATURE CANCELLATION AND DEMODULATION

(71) Applicant: Fairchild Semiconductor Corporation, San Jose, CA (US)

(72) Inventors: Shungneng Lee, Sunnyvale, CA (US); Hai Tao, Sunnyvale, CA (US); Ion Opris, San Jose, CA (US); Shanthi Pavan, Fremont, CA (US)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 532 days.

(21) Appl. No.: 14/217,842

(22) Filed: Mar. 18, 2014

(65) Prior Publication Data

US 2016/0161256 A1    Jun. 9, 2016

Related U.S. Application Data

(60) Provisional application No. 61/798,517, filed on Mar. 15, 2013.

(51) Int. Cl.
*G01C 19/00* (2013.01)
*G01C 19/5776* (2012.01)
(Continued)

(52) U.S. Cl.
CPC .......... *G01C 19/5776* (2013.01); *B81B 7/008* (2013.01); *H03L 7/087* (2013.01); *H03L 7/093* (2013.01); *H03L 7/099* (2013.01)

(58) Field of Classification Search
CPC ................................................. G01C 19/5776
(Continued)

(56) References Cited

U.S. PATENT DOCUMENTS

| 4,511,848 A | 4/1985 | Watson |
| 5,481,914 A | 1/1996 | Ward |

(Continued)

FOREIGN PATENT DOCUMENTS

| CN | 1595062 A | 3/2005 |
| CN | 1595063 A | 3/2005 |

(Continued)

OTHER PUBLICATIONS

"U.S. Appl. No. 13/860,761, Notice of Allowance mailed Apr. 28, 2015", 8 pgs.

(Continued)

*Primary Examiner* — Robert Huber
*Assistant Examiner* — Tarun Sinha
(74) *Attorney, Agent, or Firm* — Schwegman Lundberg & Woessner, P.A.

(57) ABSTRACT

This application discusses simplified interface circuits for a gyroscope. In an example, an interface can include an automatic gain control (AGC) circuit configured to couple to driver for a proof mass of a gyroscope sensor and to drive the proof-mass to oscillate at a predefined oscillation amplitude, and a phase-locked loop (PLL) configured to receive sensed oscillation information from the proof-mass and to provide at least a first phase signal synchronized with a sinusoidal waveform of the sensed oscillation information.

17 Claims, 7 Drawing Sheets

(51) Int. Cl.
  *B81B 7/00* (2006.01)
  *H03L 7/087* (2006.01)
  *H03L 7/093* (2006.01)
  *H03L 7/099* (2006.01)

(58) Field of Classification Search
  USPC .................................................. 73/504.12
  See application file for complete search history.

(56) References Cited

U.S. PATENT DOCUMENTS

| | | | |
|---|---|---|---|
| 5,491,604 | A | 2/1996 | Nguyen et al. |
| 5,600,064 | A | 2/1997 | Ward |
| 5,992,233 | A | 11/1999 | Clark |
| 6,370,937 | B2 | 4/2002 | Hsu |
| 6,664,941 | B2 | 12/2003 | Itakura et al. |
| 7,054,778 | B2 | 5/2006 | Geiger et al. |
| 7,173,402 | B2 | 2/2007 | Chen et al. |
| 7,216,525 | B2 | 5/2007 | Schroeder |
| 7,266,349 | B2 | 9/2007 | Kappes |
| 7,305,880 | B2 | 12/2007 | Caminada et al. |
| 7,339,384 | B2 | 3/2008 | Peng et al. |
| 7,444,869 | B2 | 11/2008 | Johnson et al. |
| 7,481,110 | B2 | 1/2009 | Handrich et al. |
| 7,565,839 | B2 | 7/2009 | Stewart et al. |
| 7,600,428 | B2 | 10/2009 | Robert et al. |
| 7,616,078 | B2 | 11/2009 | Prandi et al. |
| 7,859,352 | B2 | 12/2010 | Sutton |
| 7,965,067 | B2 | 6/2011 | Grönthal et al. |
| 8,004,354 | B1 | 8/2011 | Pu et al. |
| 8,037,755 | B2 | 10/2011 | Nagata et al. |
| 8,375,789 | B2 | 2/2013 | Prandi et al. |
| 8,497,746 | B2 | 7/2013 | Visconti et al. |
| 8,661,898 | B2 | 3/2014 | Watson |
| 9,052,335 | B2 | 6/2015 | Coronato et al. |
| 9,094,027 | B2 | 7/2015 | Tao et al. |
| 9,444,404 | B2 | 9/2016 | Opris et al. |
| 2001/0022106 | A1 | 9/2001 | Kato et al. |
| 2002/0196445 | A1 | 12/2002 | Mcclary et al. |
| 2003/0196475 | A1 | 10/2003 | Wyse |
| 2004/0051508 | A1 | 3/2004 | Hamon et al. |
| 2004/0085096 | A1 | 5/2004 | Ward et al. |
| 2004/0085784 | A1 | 5/2004 | Salama et al. |
| 2004/0088127 | A1 | 5/2004 | M'closkey et al. |
| 2005/0072239 | A1* | 4/2005 | Longsdorf ............ G05B 23/027 73/649 |
| 2005/0274181 | A1 | 12/2005 | Kutsuna et al. |
| 2006/0044065 | A1* | 3/2006 | Ishida .................. H03G 3/3026 330/279 |
| 2007/0180908 | A1 | 8/2007 | Seeger et al. |
| 2007/0240486 | A1 | 10/2007 | Moore et al. |
| 2008/0284365 | A1 | 11/2008 | Sri-Jayantha et al. |
| 2009/0072663 | A1 | 3/2009 | Ayazi et al. |
| 2009/0217757 | A1 | 9/2009 | Nozawa |
| 2010/0132461 | A1 | 6/2010 | Hauer et al. |
| 2010/0231452 | A1 | 9/2010 | Babakhani et al. |
| 2011/0030473 | A1 | 2/2011 | Acar |
| 2011/0074389 | A1 | 3/2011 | Knierim et al. |
| 2011/0094302 | A1 | 4/2011 | Schofield et al. |
| 2011/0120221 | A1 | 5/2011 | Yoda |
| 2011/0146403 | A1 | 6/2011 | Rizzo Piazza Roncoroni et al. |
| 2011/0179868 | A1 | 7/2011 | Kaino et al. |
| 2011/0192226 | A1* | 8/2011 | Hayner ............... G01C 19/5776 73/504.12 |
| 2011/0234312 | A1 | 9/2011 | Lachhwani et al. |
| 2011/0285445 | A1 | 11/2011 | Huang et al. |
| 2012/0191398 | A1 | 7/2012 | Murakami et al. |
| 2013/0099836 | A1* | 4/2013 | Shaeffer ............ G01C 19/5776 327/148 |
| 2013/0199294 | A1 | 8/2013 | Townsend et al. |
| 2013/0263665 | A1 | 10/2013 | Opris et al. |
| 2013/0268227 | A1 | 10/2013 | Opris et al. |
| 2013/0268228 | A1 | 10/2013 | Opris et al. |
| 2013/0269413 | A1 | 10/2013 | Tao et al. |
| 2013/0271228 | A1 | 10/2013 | Tao et al. |
| 2014/0190258 | A1 | 7/2014 | Donadel et al. |
| 2014/0306773 | A1 | 10/2014 | Kim |
| 2016/0003618 | A1 | 1/2016 | Boser et al. |

FOREIGN PATENT DOCUMENTS

| | | |
|---|---|---|
| CN | 1693181 A | 11/2005 |
| CN | 101059530 A | 10/2007 |
| CN | 101217263 A | 7/2008 |
| CN | 101329446 A | 12/2008 |
| CN | 101520327 A | 9/2009 |
| CN | 101922934 A | 12/2010 |
| CN | 201688848 U | 12/2010 |
| CN | 102109345 A | 6/2011 |
| CN | 103363969 A | 10/2013 |
| CN | 103363983 A | 10/2013 |
| CN | 103368503 A | 10/2013 |
| CN | 103376099 A | 10/2013 |
| CN | 103376102 A | 10/2013 |
| CN | 203349832 U | 12/2013 |
| CN | 203349834 U | 12/2013 |
| CN | 203719664 U | 7/2014 |
| EP | 1055910 A1 | 11/2000 |
| EP | 2096759 A1 | 9/2009 |
| EP | 2259019 A1 | 12/2010 |
| JP | 0989927 A | 4/1997 |
| JP | 10239347 A | 9/1998 |
| JP | 2009192458 A | 8/2009 |
| KR | 1020130037462 A | 10/2013 |
| KR | 1020130113385 A | 10/2013 |
| KR | 1020130113391 A | 10/2013 |
| KR | 1020130116189 A | 10/2013 |
| KR | 1020130116212 A | 10/2013 |
| WO | WO-2011107542 A2 | 9/2011 |

OTHER PUBLICATIONS

"U.S. Appl. No. 13/860,761, Response filed Apr. 16, 2015 to Advisory Action mailed Mar. 25, 2015", 11 pgs.
"Chinese Application Serial No. 201310119730.9, Office Action mailed May 4, 2015", w/ English Claims, 8 pgs.
"Chinese Application Serial No. 201310119986.X, Office Action mailed May 12, 2015", w/ English Claims, 14 pgs.
"Chinese Application Serial No. 201310127961.4, Office Action mailed May 6, 2015", w/ English Claims, 7 pgs.
"U.S. Appl. No. 13/857,349, Non Final Office Action mailed Oct. 8, 2015", 10 pgs.
"U.S. Appl. No. 13/857,349, Response filed Jan. 8, 2016 to Non Final Office Action mailed Oct. 8, 2015", 10 pgs.
"Chinese Application Serial No. 201310119730.9, Office Action mailed Jan. 29, 2016", w/ English Translation, 7 pgs.
"Chinese Application Serial No. 201310119806.8, Office Action mailed Jul. 3, 2015", w/ English Claims, 12 pgs.
"Chinese Application Serial No. 201310119806.8, Response filed Jan. 18, 2016 to Office Action mailed Jul. 3, 2015", (English Translation of Claims), 11 pgs.
"Chinese Application Serial No. 201310119986.X, Office Action mailed Dec. 18, 2015", w/ English Translation, 6 pgs.
"Chinese Application Serial No. 201310119986.X, Response filed Sep. 25, 2015 to Office Action mailed May 12, 2015", w/ English Claims, 7 pgs.
"Chinese Application Serial No. 201310127961.4, Response filed Sep. 2, 2015 to Office Action mailed May 6, 2015", w/ English Claims, 19 pgs.
"Chinese Application Serial No. 201310128046.7, Office Action mailed Jul. 23, 2015", w/ English Translation, 7 pgs.
"Chinese Application Serial No. 201310128046.7, Response filed Oct. 14, 2015 to Office Action mailed Jul. 23, 2015", w/ English Claims, 23 pgs.
"European Application Serial No. 13001720.5, Extended European Search Report mailed Aug. 20, 2015", 7 pgs.
"European Application Serial No. 13001918.5, Extended European Search Report mailed Dec. 3, 2015", 8 pgs.
"U.S. Appl. No. 13/857,349, Notice of Allowance mailed May 6, 2016", 9 pgs.

(56) References Cited

OTHER PUBLICATIONS

"U.S. Appl. No. 13/857,377, Non Final Office Action mailed Apr. 27, 2016".
"U.S. Appl. No. 13/857,377, Response filed Jul. 27, 2016 to Non Final Office Action mailed Apr. 27, 2016", 14 pgs.
"U.S. Appl. No. 13/860,780, Non Final Office Action mailed Apr. 14, 2016", 25 pgs.
"U.S. Appl. No. 13/860,780, Response filed Jul. 14, 2016 to Non Final Office Action mailed Apr. 14, 2016", 12 pgs.
"Chinese Application Serial No. 201310119730.9, Response filed Jun. 13, 2016 to Office Action mailed Jan. 29, 2016", 19 pgs.
"Chinese Application Serial No. 201310119806.8, Office Action mailed May 13, 2016", w/ English Translation, 8 pgs.
"Chinese Application Serial No. 201310119986.X, Response filed Apr. 29, 2016 to Office Action mailed Dec. 18, 2015", (English Translation of Claims), 14 pgs.
"European Application Serial No. 13001719.7, Communication Pursuant to Article 94(3) EPC mailed Jul. 4, 2016", 4 pgs.
"European Application Serial No. 13001917.7, Extended European Search Report mailed Apr. 11, 2016", 5 pgs.
"U.S. Appl. No. 13/860,761, Advisory Action mailed Mar. 25, 2015", 3 pgs.
"U.S. Appl. No. 13/860,761, Final Office Action mailed Jan. 15, 2015", 14 pgs.
"U.S. Appl. No. 13/860,761, Response filed Mar. 16, 2015 to Final Office Action mailed Jan. 16, 2015", 12 pgs.
"U.S. Appl. No. 13/860,761, Response filed Dec. 19, 2014 to Non Final Office Action mailed Aug. 19, 2014", 12 pgs.
"European Application Serial No. 13001719.7, Response filed Jan. 21, 2015", 29 pgs.
"U.S. Appl. No. 13/860,761, Non Final Office Action mailed Aug. 19, 2014", 13 pgs.
"Chinese Application Serial No. 201320172128.7, Office Action mailed Jul. 12, 2013", w/English Translation, 3 pgs.
"Chinese Application Serial No. 201320172128.7, Response filed Aug. 7, 2013 to Office Action mailed Jul. 12, 2013", w/English Translation, 39 pgs.
"Chinese Application Serial No. 201320172366.8, Office Action mailed Jan. 30, 2014", w/English Claims, 3 pgs.
"Chinese Application Serial No. 201320172366.8, Office Action mailed Jul. 9, 2013", w/English Translation, 3 pgs.
"Chinese Application Serial No. 201320172366.8, Office Action mailed Oct. 25, 2013", 8 pgs.
"Chinese Application Serial No. 201320172366.8, Response filed Mar. 18, 2014 to Office Action mailed Jan. 30, 2014", w/English Claims, 20 pgs.
"Chinese Application Serial No. 201320172366.8, Response filed Sep. 16, 2013 to Office Action mailed Jul. 9, 2013", w/English Translation, 24 pgs.
"Chinese Application Serial No. 201320172366.8, Response filed Dec. 24, 2013 to Office Action mailed Oct. 25, 2013", 11 pgs.
"Chinese Application Serial No. 201320172367.2, Office Action mailed Jul. 9, 2013", w/English Translation, 2 pgs.
"Chinese Application Serial No. 201320172367.2, Response filed Sep. 16, 2013 to Office Action mailed Jul. 9, 2013", w/English Translation, 24 pgs.
"Chinese Application Serial No. 201320185461.1, Office Action mailed Jul. 23, 2013", w/English Translation, 3 pgs.
"Chinese Application Serial No. 201320185461.1, Response filed Sep. 10, 2013 to Office Action mailed Jul. 23, 2013", w/English Translation, 25 pgs.
"Chinese Application Serial No. 201320186292.3, Office Action mailed Jul. 19, 2013", w/English Translation, 2 pgs.
"Chinese Application Serial No. 201320186292.3, Response filed Sep. 10, 2013 to Office Action mailed Jul. 19, 2013", w/English Translation, 23 pgs.
"European Application Serial No. 13001719.7, Extended European Search Report mailed Jun. 24, 2014", 10 pgs.
"European Application Serial No. 13001721.3, Extended European Search Report mailed Jul. 18, 2013", 9 pgs.
"European Application Serial No. 13001721.3, Response filed Apr. 7, 2014 to Extended European Search Report mailed Jul. 18, 2013", 25 pgs.
Ferreira, Antoine, et al., "A Survey of Modeling and Control Techniques for Micro- and Nanoelectromechanical Systems", IEEE Transactions on Systems, Man and Cybernetics—Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. Cas-23, No. 1, (1976), 45-55.
Reljin, Branimir D, "Properties of SAB filters with the two-pole single-zero compensated operational amplifier", Circuit Theory and Applications: Letters to the Editor. vol. 10, (1982), 277-297.
Sedra, Adel, et al., "Chapter 8.9: Effect of Feedback on the Amplifier Poles", Microelectronic Circuits, 5th edition, (2004), 836-864.
Song-Hee, Cindy Paik, "A MEMS-Based Precision Operational Amplifier", Submitted to the Department of Electrical Engineering and Computer Sciences MIT, [Online]. Retrieved from the Internet: <URL: http://dspace.mit.edu/bitstream/handle/1721.1/16682/57138272.pdf?. . . >, (Jan. 1, 2004), 123 pgs.
Xia, Guo-Ming, et al., "Phase correction in digital self-oscillation drive circuit for improve silicon MEMS gyroscope bias stability", Solid-State and Integrated Circuit Technology (ICSICT), 2010 10TH IEEE International Conference on, IEEE, (Nov. 1 2010), 1416-1418.
"U.S. Appl. No. 13/857,363, Non Final Office Action mailed Aug. 5, 2016", 8 pgs.
"U.S. Appl. No. 13/857,363, Response filed Nov. 7, 2016 to Non Final Office Action mailed Aug. 5, 2016", 12 pgs.
"U.S. Appl. No. 13/857,377, Non Final Office Action mailed Oct. 13, 2016", 23 pgs.
"U.S. Appl. No. 13/860,780, Final Office Action mailed Aug. 18, 2016", 25 pgs.
"U.S. Appl. No. 13/860,780, Response Filed Nov. 18, 2016 to Final Office Action Mailed Aug. 18, 2016", 7 pgs.
"Chinese Application Serial No. 201310119730.9, Office Action mailed Oct. 10, 2016", W/ English Translation, 8 pgs.
"Chinese Application Serial No. 201310119806.8, Response filed Sep. 28, 2016 to Office Action mailed May 13, 2016", with English translation of claims, 13 pgs.
"Definition of baseband signal downloaded from "Tech Terms"", (Jul. 15, 2016), 1 pg.
"European Application Serial No. 13001719.7, Response filed Nov. 9, 2016 to Communication Pursuant to Article 94(3) EPC mailed Jul. 4, 2016", 14 pgs.
"European Application Serial No. 13001918,5, Response filed Jul. 8, 2016 tp Office Action mailed Dec. 3, 2015", 36 pgs.
"Explanation of phase shifters from "Microwaves 101"", (Aug. 4, 2016), 5 pgs.

* cited by examiner

APPARATUS AND METHODS FOR PLL-BASED GYROSCOPE GAIN CONTROL, QUADRATURE CANCELLATION AND DEMODULATION

CLAIM OF PRIORITY

This application claims the benefit of priority under 35 U.S.C. 119 to Lee et al., U.S. Provisional Patent Application No. 61/798,517, entitled, "PLL-BASED DEMODULATION METHOD FOR A MEMS GYROSCOPE," filed Mar. 15, 2013, which is hereby incorporated by reference herein in its entirety.

OVERVIEW

This application discusses, among other things, simplified interface circuits for a gyroscope sensor. In an example, a gyroscope interface can include an automatic gain control (AGC) circuit configured to couple to driver for a gyroscope proof mass of a and to drive the proof-mass to oscillate at a predefined oscillation amplitude, and a phase-locked loop (PLL) configured to receive sensed oscillation information from the proof-mass and to provide at least a first phase signal synchronized with a sinusoidal waveform of the sensed oscillation information.

This overview is intended to provide a general overview of subject matter of the present patent application. It is not intended to provide an exclusive or exhaustive explanation of the invention. The detailed description is included to provide further information about the present patent application.

BACKGROUND

In the past, gyroscopes and gyroscopic devices were constructed of relatively large and expensive electromagnetic devices. These electromagnetic devices incorporated coils and position sensors mounted for relatively high speed, continuous rotational movement. Eventually, micromechanical rate gyros were developed which included components formed by semiconductor processing techniques.

Generally, the micromechanical rate gyros are constructed with a suspended proof mass. The proof mass can be mounted in a gimbal structure including mutually orthogonal flexible axes, with the mass and gimbal structure generally lying in a common plane. The proof mass and inner mounting gimbal can be oscillated or vibrated about a first of the orthogonal axes. Movement, such as rotational movement about an axis perpendicular to the common plane can produce vibrational movement about the other of the orthogonal axes. The deflections are caused by a combination of movement of the vibrating proof mass and resulting Coriolis forces. Robust performance of a gyroscope sensor can depend on the sensing and stability of the proof mass oscillations.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized an improved gyroscope interface and control architecture that can provide more precise sensing of the proof mass vibration, improved control of the proof mass vibration, reduced complexity of the automatic gain control of the proof mass drive loop, and improved cancellation of quadrature leakage into Coriolis path. In addition, the architecture can provide the above improvements using less circuit area and less power.

Figure 1A:
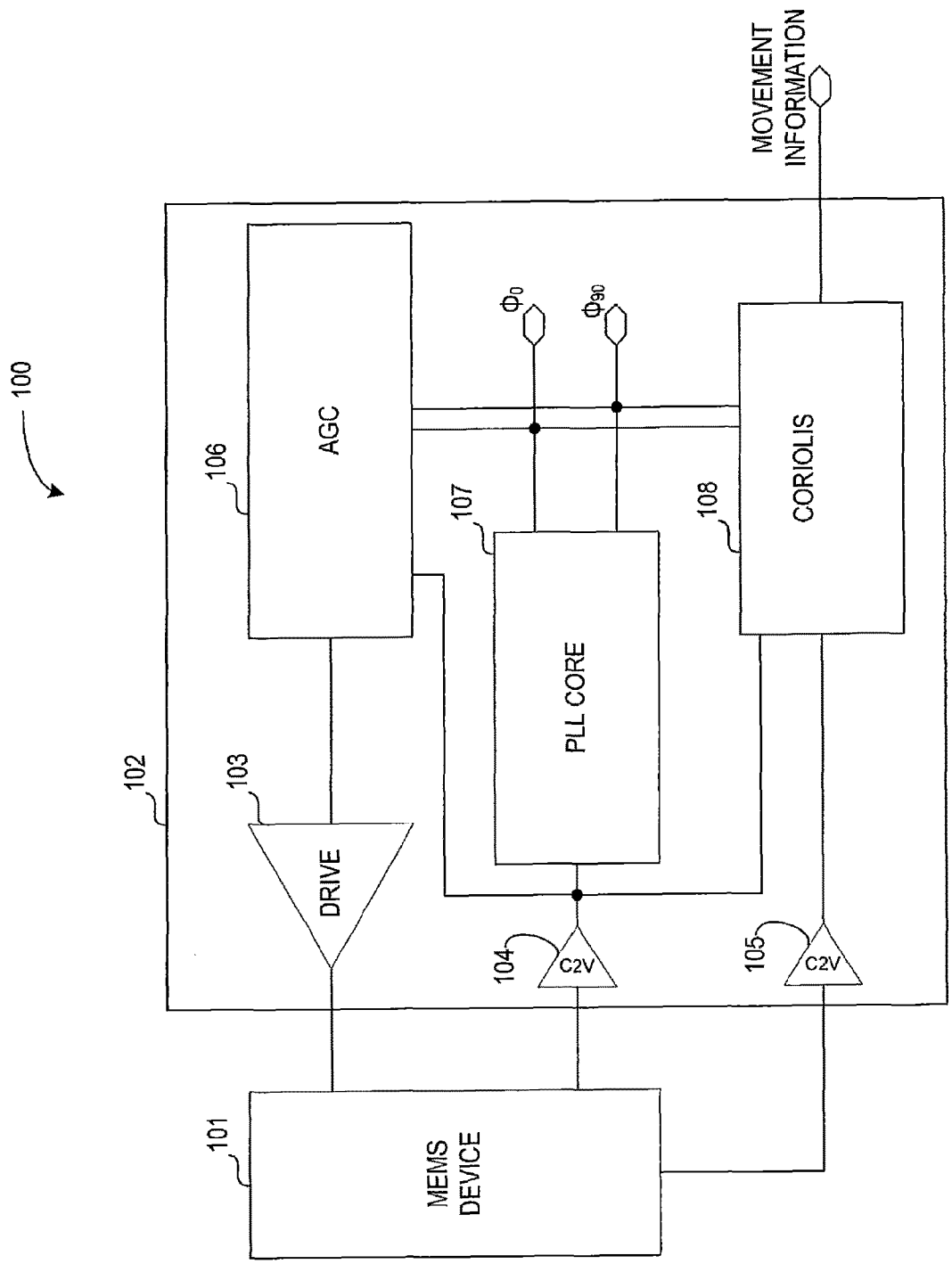
FIG. 1A illustrates generally a system including a gyroscope sensor and an example interface circuit.

FIG. 1A illustrates generally a system 100 including a gyroscope 101 and an example interface circuit 102. The gyroscope 101 can be implemented using a micro-electromechanical system (MEMS) element, a quartz-based element, etc. In certain example, the interface circuit 102 can include a drive amplifier 103, two capacitance-to-voltage (C2V) converters 104, 105, an automatic gain control (AGC) circuit 106, a phased-lock loop core 107, and a Coriolis processing path 108. In certain examples, the drive amplifier 103 can provide a drive signal to oscillate or vibrate a proof mass of the Gyroscope 101. The C2V converters 104, 105 can receive movement information using capacitive sensors responsive to various movement of the proof mass relative to support structure of the gyroscope 101 integrated with the proof mass. In certain examples, an automatic gain control circuit 106 can receive movement information from a first set of capacitive sensors via a first C2V converter 104 to provide precise control of the amplitude or phase of the proof mass vibration. In certain examples, a second set of capacitive sensors via one or more second C2V converters 105 can provide movement information of the gyroscope as a whole. The movement information can be processed through a Coriolis processing path 108 to provide movement information of the gyroscope 101, as well as, whatever device the gyroscope 101 is attached, such as a personal mobile electronic device including, but not limited to, a cellular phone, smartphone, wearable electronic, or combinations thereof. In certain examples, a PLL core 107 can receive the proof mass vibration information from the first C2V converter 104 and can provide improved and very precise phase information to the AGC circuit 106 and the Coriolis processing path 108. In existing gyroscope interface systems, the functions provided by the example PLL core 107 may be accomplished using, among other things, a band pass delta sigma, a 90 degree phase shifter, and FIR filters. In certain examples, the PLL core 106 can provide precise phase information to the AGC circuitry 106 and the Coriolis processing path 108 without the components discussed above. Thus, production of the phase information of the proof mass can be achieved using a handful registers, gates, and up/down counter. The simplification of the production of the phase information can save power and circuit area especially considering that many existing MEMS interface circuits already include a PLL to do other functions.

Figure 1B:
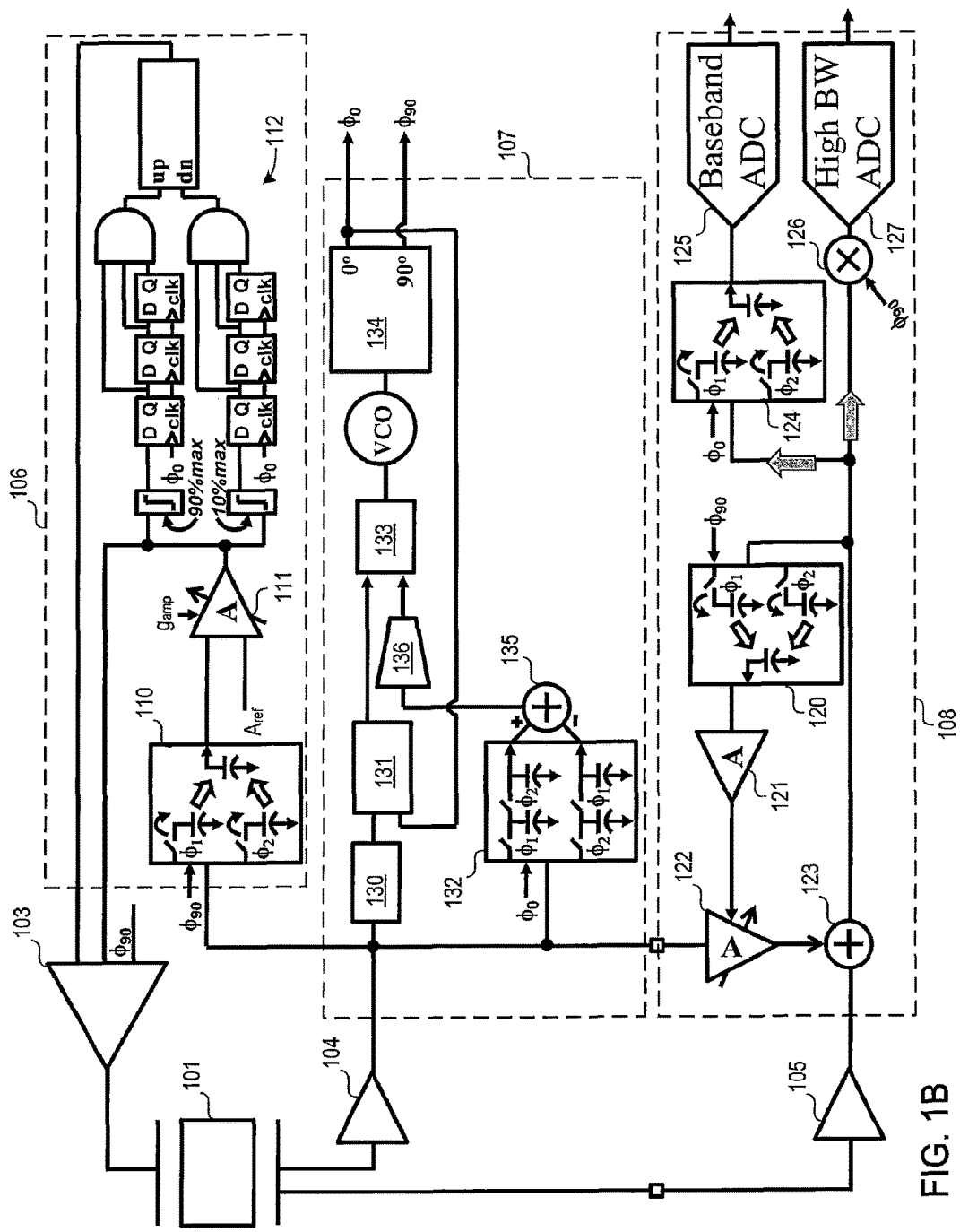
FIG. 1B illustrates generally a more detailed view of some of the components of the example system of FIG. 1A.

FIG. 1B illustrates generally a more detailed view of some of the components of the example system of FIG. 1A. In certain examples, the AGC 106 can include a rectifier 110, error amplifier 111 and coarse gain processing circuit 112. The rectifier 110 can receive the proof mass vibration information from the first C2V 104 and can provide rectified amplitude information to the error amplifier 111. As discussed below, the rectifier 110 can process the amplitude information using phase information generated by the PLL 107. The error amplifier 111 can receive the rectified amplitude information, an amplitude threshold ($A_{ref}$), and an error gain ($g_{amp}$), and can provide a fine gain signal to the drive amplifier 103 and the coarse gain processing circuit 112. In certain examples, the amplitude threshold ($A_{ref}$) represents the target amplitude of the proof mass oscillation. The coarse gain processing circuit 112 can receive the fine gain signal and can monitor the signal as it goes to an extreme (e.g., >90%, <10%) of a predefined range. If the fine gain signal remains at an extreme for one or more phase iterations, an up/down counter 113 can increment or decrement to adjust a coarse gain of the drive amplifier 103. In certain examples, as the coarse gain is adjusted, the fine gain can be reset.

In certain examples, the Coriolis processing path 108 can include a quadrature rectifier 120, a number of amplifiers 121, 122 and a summing node 123 to cancel quadrature effects of the vibrating proof mass that can be present in the movement information provided by the second one or more C2Vs 105. In certain examples, the Coriolis processing path 108 can optionally include a rate rectifier 124 and baseband analog-to-digital converter (ADC) 125 for providing low-bandwidth, low-power, movement information. In certain examples, the Coriolis processing path 108 can optionally include a demodulator 126 and a high-bandwidth ADC 127 to provide high resolution movement information.

Figure 5:
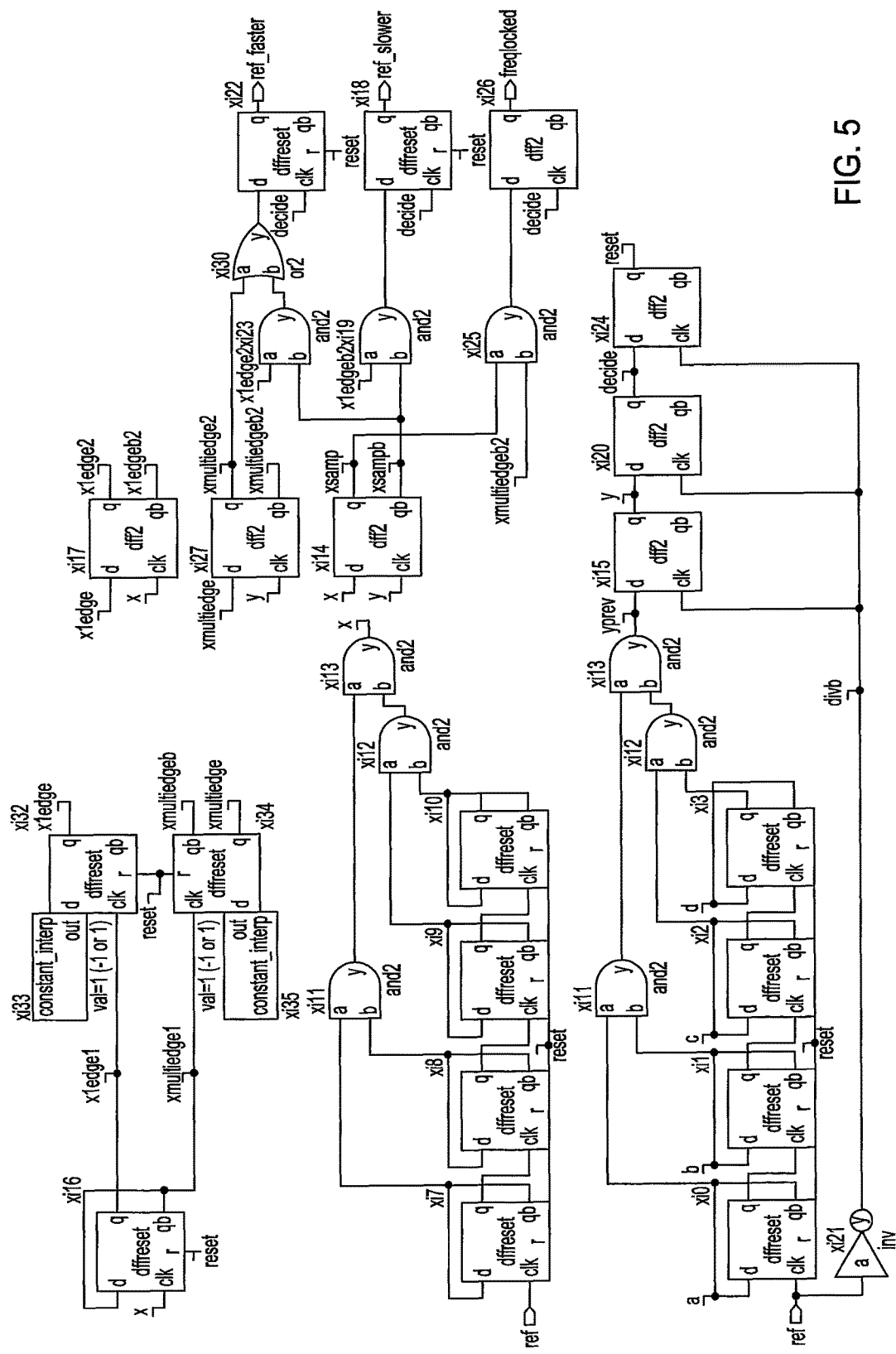
FIG. 5 illustrates an example implementation of a coarse phase-frequency detector (PFD).

In certain examples, the PLL core 107 can include a start-up and slicer circuit 130, a coarse phase-frequency detector (PFD) 131, a fine phase detector (PD) 132, a loop filter 133, a voltage controlled oscillator (VCO), and a phase generator 134. In certain examples, the start-up and slicer circuit 130 can convert analog poof mass vibration information into a digital representation of the proof mass vibration information. The coarse PFD 131 can receive the digital representation of the proof mass vibration information and can provide a coarse signal for the VCO that can be roughly in-phase with the proof mass vibration or oscillation phase. There are many implementations for a coarse PFD 131, FIG. 5 illustrates an example implementation. In certain examples, the fine PD 132 can provide fine phase adjustments to the output of the coarse PFD 131 using the loop filter 133. In some examples, a feedback loop from the output of the phase generator 134 can provide the fine adjustment information to the coarse PFD 131. The specific implementation of the fine PD 132 is discussed below. In certain examples, the fine PD can include a summing node 135 or amplifier 136 or both to provide fine adjustment information to the loop filter 133. In certain examples, the PLL core 107 can replace a number of other components of existing MEMS interface systems, such as but not limited to, phase shifters, bandpass delta-sigma, FIR filters, etc., to provide a simplified and more precise phase generation mechanism that reduces circuit area and can save energy.

Figure 2:
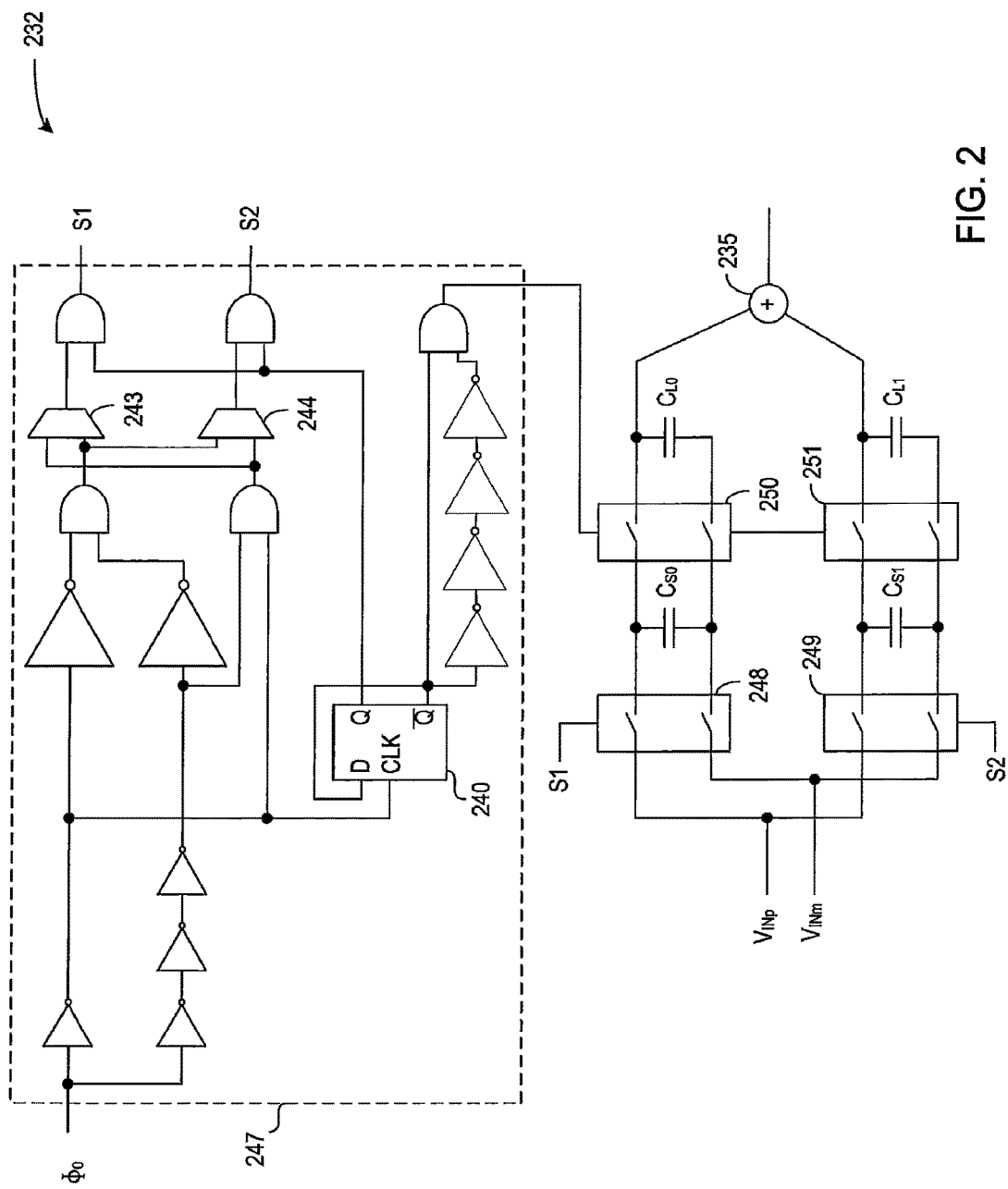
FIG. 2 illustrates generally an example implementation of a fine phase detector (PD), or adjacent sampler as it can sometimes be called.

FIG. 2 illustrates generally an example implementation the fine PD 232, or adjacent sampler as it can sometimes be called. In certain examples, the fine PD 232 can include triggering logic 247, and an array of switches including a first sample switch 248, a second sample switch 249, a first dump switch 250, and a second dump switch 251 for sampling the sensed vibration signal ($V_{INp}$, $V_{INm}$). In certain examples, the fine PD 232 can sample adjacent zero-crossings of the sensed vibration signal ($V_{INp}$, $V_{INm}$) of the proof mass using a number of small capacitors ($C_{S0}$, $C_{S1}$, $C_{L0}$, $C_{L1}$). In certain examples, the samples are triggered to be taken at or near the zero crossing ($\Phi_0$) of the sensed vibration signal ($V_{INp}$, $V_{INm}$). In some examples, adjacent samples can be compared, or summed to provide a phase error of the trigger signal ($\Phi_0$). The error can then be adjusted by an error amplifier (FIG. 1B, 136) and provided to a loop filter (FIG. 1B, 133) for adjusting the phase of the PLL core VCO. In some examples, one or more of the comparator or summer 235, and the error amplifier can optionally be part of the fine PD 232. In some examples, the triggering logic 247 can include a flip-flop 240 to dump the sample capacitors ($C_{S0}$, $C_{S1}$) to corresponding load capacitors ($C_{L0}$, $C_{L1}$). In some examples, the fine PD 232 can optionally include multiplexers 243, 244 for allowing the polarity of certain samples of the vibration signal to be selected. It is understood that the fine PD 232 can be configured to sample the vibration signal of the proof mass at other phase positions other than at the zero-crossing based on some other reference without departing from the scope of the present subject matter.

In certain examples, a method for operating the fine PD 232 and sampling adjacent zero-crossings of the sensed vibration signal of the proof mass can include sampling a first zero-crossing of the sensed vibration signal ($V_{INp}$, $V_{INm}$) of the proof mass using the first sample capacitor ($C_{S0}$) and the phase signal, sampling a subsequent, adjacent zero-crossing of the sensed vibration signal ($V_{INp}$, $V_{INm}$) of the proof mass using the second sampling capacitor ($C_{S1}$) and the phase signal and dumping the voltages from the first and second sampling capacitors ($C_{S0}$, $C_{S1}$) to the corresponding first and second output or load capacitors ($C_{L0}$, $C_{L1}$) using the phase signal.

In certain examples, the fine PD 232 can receive the phase signal ($\Phi_0$) including a transition at $t_0$. A first sample of the analog representation of the sensed oscillation motion, or sensed vibration signal ($V_{INp}$, $V_{INm}$) can be taken by coupling the first sampling capacitor ($C_{S0}$) with the vibration signal ($V_{INp}$, $V_{INm}$) at $t_0$+dt using the first sampling switch 248. At $t_1$, the first sampling capacitor ($C_{S0}$) can be isolated from the sensed vibration signal ($V_{INp}$, $V_{INm}$) using the first sampling switch 248. A second adjacent sample of the sensed vibration signal ($V_{INp}$, $V_{INm}$) can be taken by coupling the second sampling capacitor ($C_{S1}$) with the vibration signal ($V_{INp}$, $V_{INm}$) at $t_1$+dt using the second sampling switch 249. At $t_2$, the second sampling capacitor ($C_{S1}$) can be isolated from the sensed vibration signal ($V_{INp}$, $V_{INm}$) using the second sampling switch 249. The voltages or charge on the sampling capacitors can then be transferred to the load capacitors ($C_{L0}$, $C_{L1}$) at $t_2$+dt using the first and second dump switches 250, 251. The sampling capacitors ($C_{S0}$, $C_{S1}$) and the load capacitors ($C_{L0}$, $C_{L1}$) can be isolated from each other at $t_3$ using the first and second dump switches 250, 25. The sampling method can resume from the beginning on a subsequent transition of the phase signal ($\Phi_0$).

In some examples, one or more zero-crossings of the sensed vibration signal ($V_{INp}$, $V_{INm}$) of the proof mass are not sensed when the voltage from the sampling capacitors ($C_{S0}$, $C_{S1}$) is transferred to the output capacitors ($C_{L0}$, $C_{L1}$). In some examples during typical operation, the sampling capacitors ($C_{S0}$, $C_{S1}$) and the output capacitors ($C_{L0}$, $C_{L1}$) are not discharged. In certain examples, a summing node can sum the voltages of the output capacitors and can provide a phase error signal. The phase error signal can be used to provide a phase correction to a VCO of the PLL. In certain examples, the use of the fine PD in combination with the coarse PFD can align the sinusoidal zero-crossing and the zero-phase clock without any issues from process or temperature variations. In certain examples, the use of the fine PD in combination with the coarse PFD can effectively cancel non-output output voltage provided via the C2V amplifier (FIG. 1, 104).

In certain examples, the fine PD 232 can cancel comparator drift, charge pump drift, and PLL post divider/phase generator delays, to generate accurate phase sampler clocks. In some examples the fine PD 232 can provide extremely accurate sampling and 90 degree phase relationship. In addition, the fine PD can greatly improve noise performance, demodulation accuracy, and immunity to quadrature leakage into the Coriolis processing path.

In certain examples, the output voltage ($V_{samp}[n]$) of an output capacitor can be given by, $$V_{OUT}[n] = \frac{C_{OUT} V_{OUT}[n-1] + C_s V_s}{C_{OUT} + C_s},$$

Where $C_{OUT}$ is the capacitance of the output capacitor, n is the sample number, $C_s$ is the capacitance of the sample capacitor of interest, and $V_S$ is the voltage on $C_s$. In certain examples, the adjacent sampler can provide a low pass filter with bandwidth. The frequency bandwidth can be given by, $$f_{BW} = \frac{f_{clk} C_s}{2\pi C_{OUT}},$$

Where $f_{clk}$ is the frequency of the phase signal. In certain examples, noise voltage ($v_n$) of an example adjacent sampler can be given by, $$v_n = \sqrt{0.5 \frac{V_n^2}{Hz} F_{BWn} \frac{C_s}{C_s + C_{OUT}} \frac{\pi}{2} + \frac{kT}{C_{OUT}}}.$$

Figure 3:
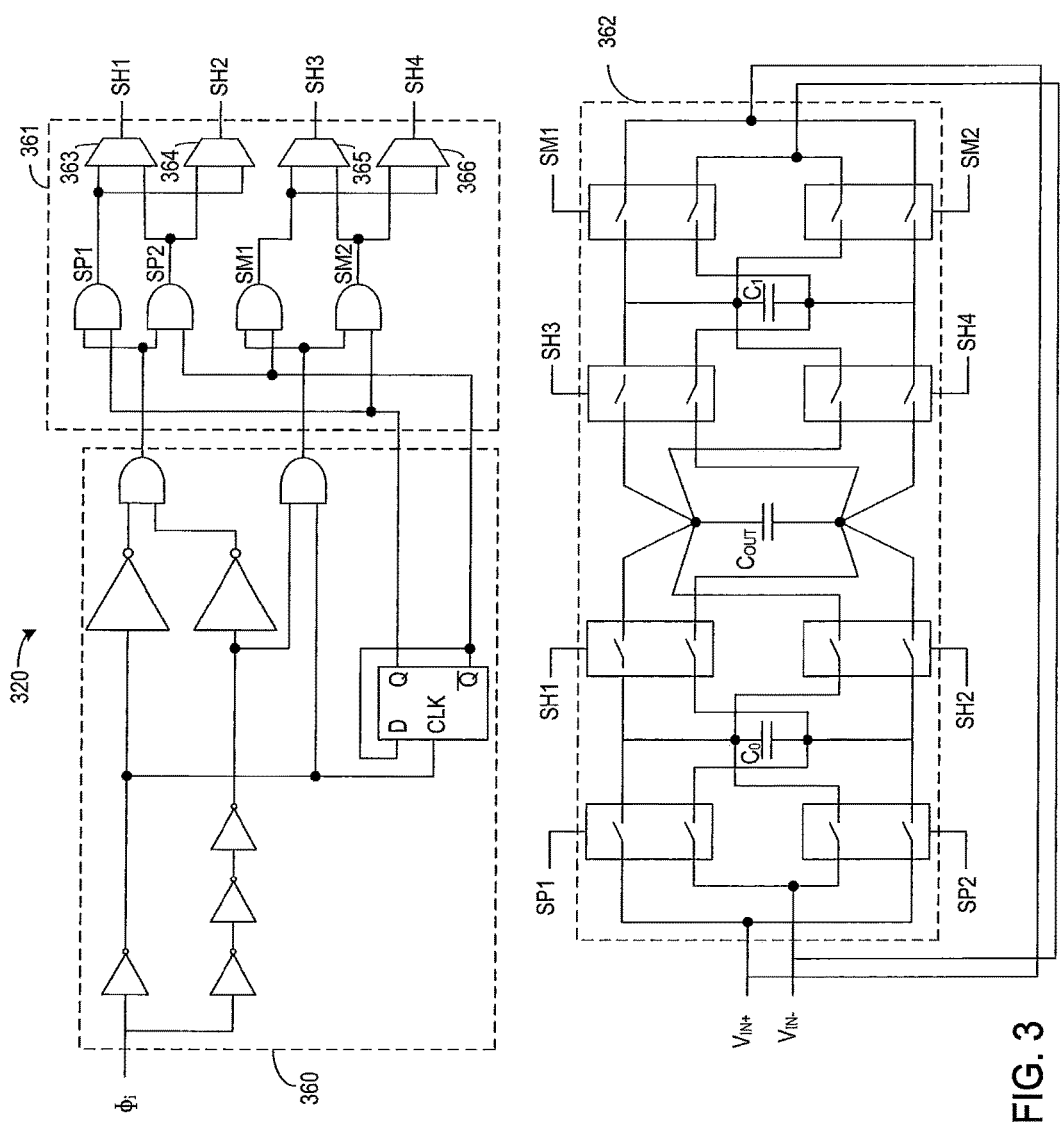
FIG. 3 illustrates generally an example rectifier, or peak sampler.

FIG. 3 illustrates generally an example rectifier 320, or peak sampler, that can be used to rectify the sensed vibration or oscillation signal of the proof mass, the Coriolis signal for one or more capacitive deflection sensor of the proof mass for quadrature cancellation, or for the Coriolis signal for one or more capacitive deflection sensors of the proof mass for providing movement information. In certain examples, the rectifier 320 can include first triggering logic 360, second triggering logic 361, and a switch array 362. In certain examples, the first triggering logic 360 can receive a phase signal ($\Phi_i$) to trigger the selection of capacitors ($C_0$, $C_1$, $C_{OUT}$) to which to connect the input signals ($V_{IN+}$, $V_{IN-}$). In some examples, where the rectifier 320 is used to rectify the sensed oscillation signal of the proof mass, such as for the providing feedback to the automatic gain control circuit, or for use in canceling quadrature in the Coriolis processing path, the rectifier can receive a 90° phase so has to capture the sensed proof mass oscillation signal. In some examples, where the rectifier 320 is used to capture movement information such as rate of rotation information, the rectifier can receive a 0° phase signal. In certain examples, the first and second triggering logic 360, 361 can use the phase signal ($\Phi_i$) to trigger a switch array 362 to capture the amplitude of the input signal ($V_{IN+}$, $V_{IN-}$) of interest by sampling the signal to two or more intermediate capacitors ($C_0$, $C_1$) and further to an output capacitor ($C_{OUT}$). In certain examples, the second triggering logic can optionally include one or more multiplexers 363, 364, 365, 366 responsive to control signals for allowing pre-programming of the rectifier 320 for a desired polarity sampling sequence. In operation, the rectifier 320 can receive the phase signal ($\Phi_i$) including a transition at $t_0$, a first intermediate capacitor $C_0$ can be coupled to the input signal ($V_{IN+}$, $V_{IN-}$) at $t_0+dt$, the first intermediate capacitor $C_0$ can be isolated from the input signal ($V_{IN+}$, $V_{IN-}$) at $t_1$. The first intermediate capacitor $C_0$ can be coupled to the output capacitor $C_{OUT}$ and the second intermediate capacitor $C_1$ can be coupled to the input signal ($V_{IN+}$, $V_{IN-}$) at $t_1+dt$. The first intermediate capacitor $C_0$ can be isolated from the output capacitor $C_{OUT}$ and the second intermediate capacitor $C_1$ can be isolated from the input signal ($V_{IN+}$, $V_{IN-}$) at $t_2$. At $t_2+dt$, the second intermediate capacitor $C_1$ can be coupled to the output capacitor $C_{OUT}$ and the first intermediate capacitor $C_0$ can be coupled to the input signal ($V_{IN+}$, $V_{IN-}$) to begin repetition of the method. In certain examples, the rectifier can be implemented with more than three sampling capacitors.

In certain examples, the output voltage ($V_{out}[n]$) of the output capacitor $C_{OUT}$ can be given by, $$V_{out}[n] = \frac{C_{OUT} V_{out}[n-1] + C_s V_s (-1)^n}{C_{OUT} + C_s},$$

Where $C_{OUT}$ is the capacitance of the output capacitor, n is the sample number, $C_s$ is the capacitance of one of the sample capacitors (C0, C1), and $V_s$ is the voltage of the sample capacitor of interest. In certain examples, the peak sampler can provide a low pass filter with bandwidth. The frequency bandwidth can be given by, $$f_{BW} = \frac{f_{clk}(C0 + C1)}{2\pi C_{OUT}},$$

Where $f_{clk}$ is the frequency of the phase signal. In certain examples, noise voltage ($v_n$) of an example peak sampler can be given by, $$v_n = \sqrt{0.5 \frac{V_n^2}{Hz} F_{BWn} \frac{C_s}{C_s + C_{OUT}} \frac{\pi}{2} + \frac{kT}{C_{OUT}}}.$$

Figure 4:
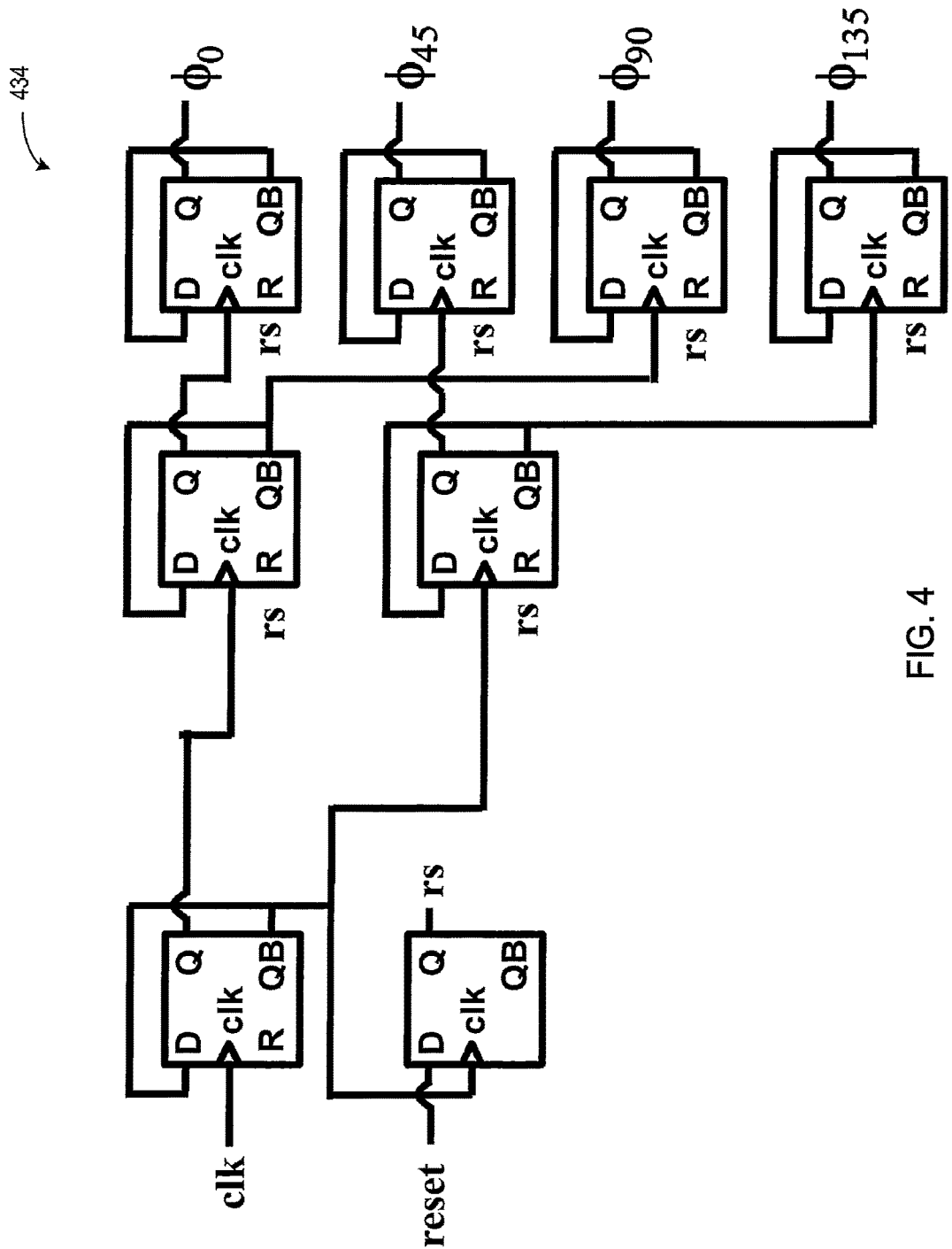
FIG. 4 illustrates generally an example phase generator.

FIG. 4 illustrates generally an example phase generator 434. The phase generator can receive a clock signal such as a clock signal (clk) from a VCO and can generate accurate 0, 45, 90, and 135 degree clocks using the illustrated combination of D flip-flops. In certain examples, the Φ0 output locks the PLL to the sign-crossing of a C2V output. Φ90 is 90 degrees from Φ0 and can drive a gyroscope drive to provide a correct phase shift/condition. Since MEMS gyroscopes are typically high-Q, a MEMS gyroscope can provide required phase correction to fulfill the exact phase criterion to provide oscillation without much loss in signal amplitude. In certain examples, any residual error can be calibrated out using the fine PD. In certain examples, a reset input can allow each of the flip-flops to be reset and can allow the phase generator to be rest to a known state.

FIG. 5 illustrates an example implementation of a coarse PFD. The coarse PFD can receive a square wave representation of the sensed oscillation of the proof mass at a first input (ref). The coarse PFD can receive a feedback phase output at a second input (div). The coarse PFD uses a number of delay elements to compare the relative transition locations of the square wave and the phase signal to determine whether the VCO needs to run at a higher frequency (ref_faster), the VCO needs to run at a slower frequency (ref_slower), or the signals are locked in phase (freqlocked).

Figure 6:
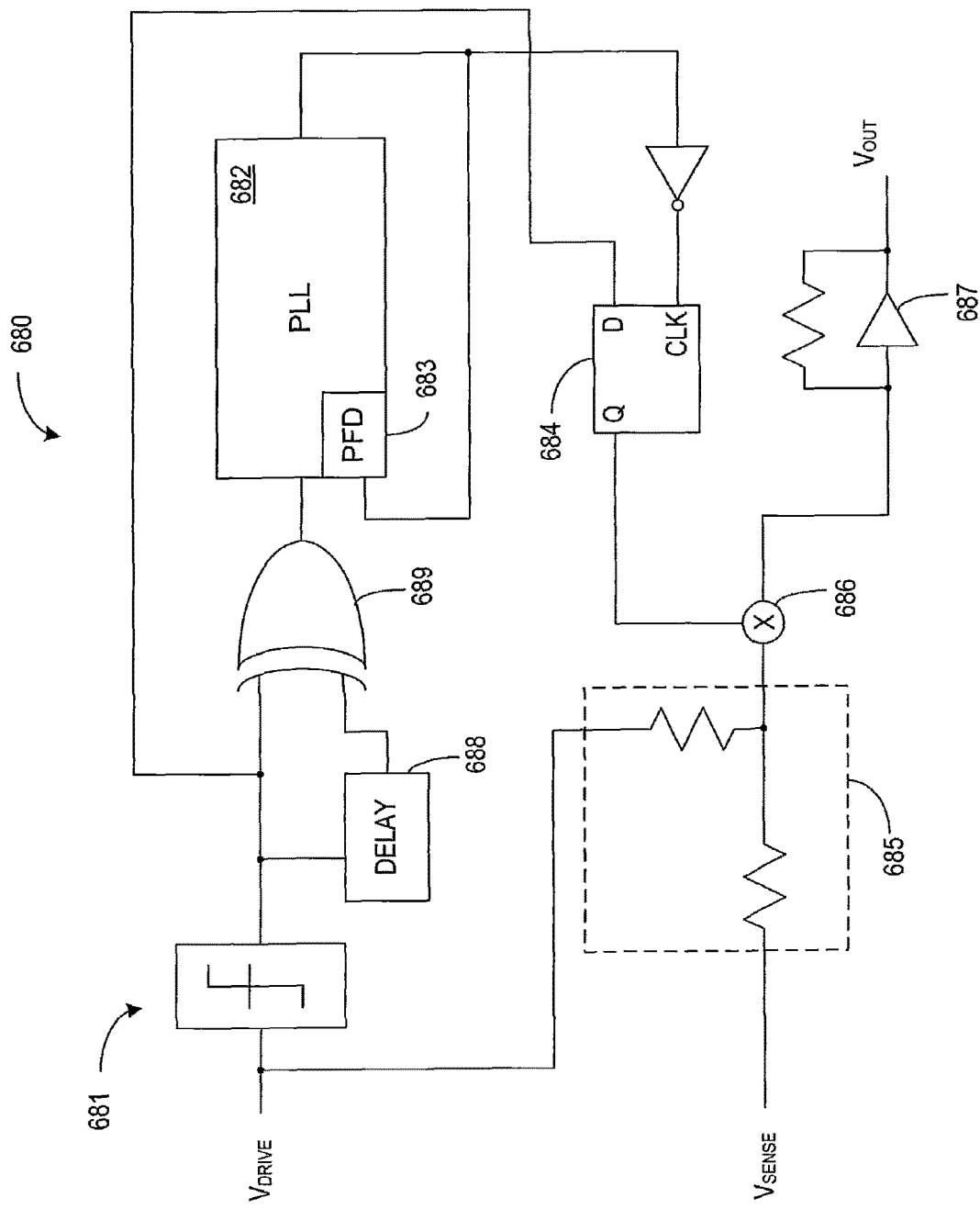
FIG. 6 illustrates and example phase-lock loop (PLL) based demodulation circuit for a gyroscope sensor.

FIG. 6 illustrates generally an example PLL-based demodulator circuit 680 for a gyroscope, such as a MEMS gyroscope. The PLL-based demodulator circuit 680 can include a slice circuit 681, a PLL 682 including a phase frequency detector (PFD) 683, a register 684, a quadrature cancelation circuit 685, a demodulator 686, and an output amplifier 687. The PLL-based demodulation circuit 680 does not include a 90° phase shifter. The slice circuit 681 can provide a square-wave representation of sensed proof mass vibration. For example, sliced output from a drive C2V can be delayed with a few inverters 688. The delayed signal, along with the original drive C2V output can be sent through an XOR gate 689 to generate 2*Frq (40 kHz in this example) reference to the PLL 682. All positive edges of the 40 kHz reference are aligned to the edges of the original drive C2V sliced output. The duty cycle may not be 50%, but the feedback clock from the output of the PLL 682 back into the phase detector is 50% duty cycle. The PFD 683 can align all positive edges entering the PFD 683. The C2V sliced output may not be 50% duty cycle in cases where the slice circuit does not slice at the midpoint. Since the PLL 682 updates on positive and negative edges of the sliced C2V output, the PFD 683 can align the feedback clock such that the offset in the slicer 681 is cancelled and all we are left with between phase mismatch of the feedback 40 kHz and 20 kHz C2V output is the comparator delay. The PLL 682 can be implemented as described above without 90° phase shifters, fir filters, etc. to provide very accurate phase signals for demodulating the sensor information received from the sensor electrode of the MEMS gyroscope.

Additional Notes

A system or apparatus can include, or can optionally be combined with any portion or combination of any portions of any one or more of the examples or illustrations above to include, means for performing any one or more of the functions described above, or a machine-readable medium including instructions that, when performed by a machine, cause the machine to perform any one or more of the functions described above.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A micro-electromechanical system (MEMS) sensor interface comprising:
    an automatic gain control (AGC) circuit configured to couple to driver for a proof mass of a gyroscope and to drive the proof-mass to oscillate at a predefined oscillation amplitude; and
    a phase-locked loop (PLL) configured to receive sensed oscillation information from the proof-mass and to provide at least a first phase signal synchronized with a sinusoidal waveform of the sensed oscillation information, wherein the PLL includes:
        a phase generator configured to receive a PLL dock signal and to provide the first phase signal synchronized in phase with the PLL clock signal;
        a voltage controlled oscillator configured to provide the PLL clock signal;
        a loop filter configured to receive a coarse PLL command signal and a phase error signal and to provide a PLL command signal to the VCO using the coarse PLL command signal and the phase error signal;
        a coarse phase frequency detector(PFD) configured to receive a square-wave representation of the oscillation information and to provide the coarse PLL command signal to the VCO; and
        a fine phase detector (PD) configured to receive an analog representation of the oscillation information, to receive the first phase signal and to provide the phase error information.

2. The interface of claim 1, wherein the fine PD includes:
    at least two sample circuits, each circuit including a sample capacitor;
    a sample switch configured to receive the analog representation of the oscillation information, to couple the first sample capacitor to the analog representation of the oscillation information in a first state of the sample switch and to isolate the the first sample capacitor from the analog representation of the oscillation information in a second state of the sample switch;

an output capacitor; and a dump switch coupled between the sample capacitor and the output capacitor, the dump switch configured to couple the sample capacitor with the output capacitor in a first state of the dump switch and to isolate the output capacitor from the sample capacitor in a second state of the dump switch.

3. The interface of claim 2, wherein the first state of the sample switch is responsive to the first phase signal, wherein the first phase signal is representative of a zero-crossing of the analog representation of the oscillation information.

4. The interface of claim 3, wherein a voltage of the output capacitor is indicative of an amplitude of the analog representation of the oscillation information at a transition of the sample switch.

5. The interface of claim 4, wherein the fine PD includes a phase error summer configured to couple to the output capacitor of each of the at least two sample circuits and to provide the phase error information.

6. The interface of claim 1, wherein the AGC circuit includes:

an up/down counter configured to provide a coarse gain signal to a proof mass drive when a fine gain signal remains at a high or low extreme for a predetermined number of oscillations of the proof-mass;

an amplifier configured to receive rectified amplitude information of the proof mass, to receive an amplitude threshold, and to compare the rectified amplitude information to the amplitude threshold to provide the fine gain signal; and a rectifier including a plurality of capacitors for providing the rectified amplitude information.

7. The interface of claim 6, wherein the rectifier is configured to receive a second phase signal from the PLL, wherein the second phase signal is representative of a 90 degree offset from a zero-crossing of the analog representation of the oscillation information.

8. A method for oscillating a proof-mass of a microelectromechanical system (MEMS) sensor, the method comprising:

providing an oscillation drive signal at a proof mass driver from an automatic gain control circuit;

receiving sensed oscillation information from the proof-mass at a phase-locked loop (PLL);

providing at least a first phase signal synchronized with a sinusoidal waveform of the sensed oscillation information using the PLL;

receiving the sensed oscillation information from the proof-mass at the AGC;

comparing the sensed oscillation information with a threshold amplitude to provide an amplitude error signal using the first phase signal; and wherein the providing at least a first phase signal synchronized with a sinusoidal waveform of the sensed oscillation information using the PLL includes receiving a PLL clock signal at a phase generator of the PLL to provide phase synchronizing of the first phase signal with the PLL clock signal using a coarse phase frequency detector (PFD) and a fine phase detector (PD).

9. The method of claim 8, wherein the providing at least a first phase signal synchronized with a sinusoidal waveform of the sensed oscillation information using the PLL includes:

providing the PLL clock signal using a voltage controlled oscillator (VCO) of the PLL;

receiving a coarse PLL command signal and a phase error signal at a loop filter providing a PLL command signal to the VCO using the coarse PLL command signal and the phase error signal and the loop filter;

receiving a square-wave representation of the oscillation information at the coarse PFD;

providing the coarse PLL command signal to the VCO using the coarse PFD;

receiving an analog representation of the oscillation information and a second phase signal at the fine PD; and providing the phase error information using the fine PD.

10. The method of claim 9, wherein providing the phase error information includes summing adjacent samples of the analog representation of the oscillation information, wherein the adjacent samples are triggered using the second phase signal;

wherein the second phase signal is representative of zero-crossing events of the analog representation of the oscillation information; and wherein the adjacent samples represent amplitudes of the analog representation of the oscillation information at representative adjacent zero-crossing events.

11. The method of claim 10, wherein the summing the adjacent samples includes;

collecting a first sample near a first zero-crossing using a first sample capacitor and a first sample switch responsive to the second phase signal; and collecting a second sample near a second zero-crossing adjacent the first zero-crossing using a second sample capacitor and a second sample switch responsive to the second phase signal.

12. The method of claim 11, wherein the collecting the first sample includes coupling the first sample capacitor to the analog representation of the oscillation information near the first zero-crossing for a first interval of time;

isolating the first sample capacitor from the analog representation of the oscillation information after completion of the first interval;

coupling the second sample capacitor to the analog representation of the oscillation information near the second zero-crossing for a second interval of time;

isolating the second sample capacitor from the analog representation of the oscillation information after completion of the second interval.

13. The method of claim 12, wherein the providing the adjacent samples includes simultaneously dumping a voltage of the first sampling capacitor and a voltage of the second sampling capacitor to respective first and second output capacitors using first and second dump switches.

14. The method of claim 8, wherein the providing the oscillation drive signal includes:

providing a coarse gain signal and a fine gain signal from the AGC to the proof mass driver.

15. The method of claim 14 wherein providing the coarse gain signal includes adjusting the coarse gain signal using an up down counter when the fine gain signal of the AGC remains at a high or low extreme for a predetermined number of oscillations of the proof-mass.

16. The method of claim 14, wherein providing the fine gain signal includes:

providing rectified amplitude information of the proof mass using a plurality of capacitors of a rectifier of the AGC and the first phase signal;

receiving the receive rectified amplitude information of the proof mass and an amplitude threshold at an amplifier of the AGC; and comparing the rectified amplitude information to the amplitude threshold to provide the fine gain signal.

17. The method of claim 16, wherein the first phase signal is representative of a 90 degree offset from a zero-crossing of the analog representation of the oscillation information.

* * * * *